United States Patent
Patra et al.

(10) Patent No.: US 9,933,704 B2
(45) Date of Patent: Apr. 3, 2018

(54) MICROLITHOGRAPHY ILLUMINATION OPTICAL SYSTEM AND MICROLITHOGRAPHY PROJECTION EXPOSURE APPARATUS INCLUDING SAME

(71) Applicant: Carl Zeiss SMT GmbH, Oberkochen (DE)

(72) Inventors: Michael Patra, Oberkochen (DE); Markus Deguenther, Aalen (DE); Michael Layh, Altusried (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1413 days.

(21) Appl. No.: 13/681,938

(22) Filed: Nov. 20, 2012

(65) Prior Publication Data

US 2013/0077076 A1    Mar. 28, 2013

Related U.S. Application Data

(63) Continuation of application No. PCT/EP2011/059427, filed on Jun. 8, 2011.

(Continued)

(30) Foreign Application Priority Data

Jun. 15, 2010 (DE) .................. 10 2010 030 089

(51) Int. Cl.
*G03F 7/20* (2006.01)

(52) U.S. Cl.
CPC ...... *G03F 7/70091* (2013.01); *G03F 7/70075* (2013.01); *G03F 7/70083* (2013.01); *G03F 7/70116* (2013.01)

(58) Field of Classification Search
CPC .................................................. G03F 7/70075
See application file for complete search history.

(56) References Cited

U.S. PATENT DOCUMENTS

| 6,259,513 B1 | 7/2001 | Gallatin et al. |
| 6,285,855 B1 | 9/2001 | Tsuji |

(Continued)

FOREIGN PATENT DOCUMENTS

| DE | 10 2004 063 848 | 9/2005 |
| DE | 10 2008 009 600 | 8/2009 |

(Continued)

OTHER PUBLICATIONS

German Examination Report, with English translation, for corresponding DE Appl No. 10 2010 030 089.6, dated Jan. 26, 2011.

(Continued)

*Primary Examiner* — Chia-How Michael Liu
(74) *Attorney, Agent, or Firm* — Fish & Richardson P.C.

(57) ABSTRACT

A microlithography illumination optical system is used to guide illumination light from a primary light source to an object field. A mirror array of the illumination optical system has a plurality of individual mirrors, which can be tilted independently of one another by actuators and are connected to associated tilting actuators. A controller is used to activate the actuators. A raster module of the illumination optical system has a plurality of raster elements to produce a spatially distributed arrangement of secondary light sources.

19 Claims, 12 Drawing Sheets

Related U.S. Application Data

(60) Provisional application No. 61/354,772, filed on Jun. 15, 2010.

(56) References Cited

U.S. PATENT DOCUMENTS

| | | | |
|---|---|---|---|
| 8,467,031 B2 * | 6/2013 | Schubert | G03F 7/70116 355/52 |
| 2008/0225256 A1 | 9/2008 | Kita | |
| 2008/0239268 A1 | 10/2008 | Mulder et al. | |
| 2009/0021715 A1 | 1/2009 | Deguenther et al. | |
| 2009/0109417 A1 | 4/2009 | Tanitsu | |
| 2009/0115990 A1 | 5/2009 | Owa et al. | |
| 2011/0177463 A1 | 7/2011 | Layh et al. | |

FOREIGN PATENT DOCUMENTS

| | | |
|---|---|---|
| DE | 10 2009 017 941 | 12/2009 |
| DE | 10 2008 042 462 | 4/2010 |
| DE | 10 2009 009 568 | 4/2010 |
| EP | 1 262 836 | 12/2002 |
| EP | 2 146 248 A1 | 1/2010 |
| EP | 2 328 028 A1 | 6/2011 |
| EP | 2 620 801 A2 | 7/2013 |
| JP | H10-233362 A | 9/1998 |
| JP | H10-270312 A | 10/1998 |
| JP | 2004-245912 A | 9/2004 |
| JP | 2006-253529 A | 9/2006 |
| JP | 2008-227497 A | 9/2008 |
| JP | 2008-258605 A | 10/2008 |
| JP | 2009-105396 A | 5/2009 |
| TW | 200900874 A | 1/2009 |
| TW | 200935180 A | 8/2009 |
| WO | WO 2007/093433 | 8/2007 |
| WO | WO 2009/070231 | 6/2009 |
| WO | WO 2009/080231 A1 | 7/2009 |

OTHER PUBLICATIONS

Taiwanese office action, with English translation thereof, for TW Application No. 100 120 852, dated Nov. 23, 2015.

International Search Report for corresponding PCT Appl No. PCT/EP2011/059427, dated Dec. 7, 2011.

Japanese office action, with English translation thereof, for JP Appl No. 2013-514638, dated Sep. 5, 2014.

* cited by examiner

MICROLITHOGRAPHY ILLUMINATION OPTICAL SYSTEM AND MICROLITHOGRAPHY PROJECTION EXPOSURE APPARATUS INCLUDING SAME

CROSS-REFERENCE TO RELATED APPLICATIONS

The present application is a continuation of, and claims benefit under 35 USC 120 to, international application PCT/EP2011/059427, filed Jun. 8, 2011, which claims benefit under 35 USC 119 of German Application No. DE 10 2010 030 089.6, filed Jun. 15, 2010 and under 35 USC 119(e) of U.S. Ser. No. 61/354,772, filed Jun. 15, 2010. International application PCT/EP2011/059427 incorporates by reference DE 10 2010 030 089.6 and U.S. Ser. No. 61/354,772. The present application incorporates by reference PCT/EP2011/059427, DE 10 2010 030 089.6 and U.S. Ser. No. 61/354,772 in their entirety.

FIELD

The disclosure relates to a microlithography illumination optical system for guiding illumination light from a primary light source to an object field. The disclosure further relates to an optical system with such an illumination optical system and a projection optical system for imaging the object field in an image field. Furthermore, the disclosure relates to a microlithography projection exposure system with such optical system and a primary light source, as well as a corresponding method for manufacturing microstructured or nanostructured components and a component produced by such a method.

BACKGROUND

Microlithography illumination optical systems are known from WO 2007/093433 A1 and EP 1 262 836 A1. For demanding projection tasks, it is desirable to be able to influence the illumination light properties in a targeted manner over the illumination or object field.

SUMMARY

The disclosure develops a microlithography illumination optical system configured so that the illumination intensity over the object field can be influenced in a targeted or desired manner with respect to the total illumination intensity and/or with regard to the intensity amounts from different illumination directions.

The disclosure makes use of the knowledge that, in practice, an emergent angle of the illumination light part bundles leaving the raster module generally depends on the angles of incidence of the illumination light part bundles which enter the raster module. Depending on the respective actual angle of incidence on the raster element, the raster module produces a different intensity course of an illumination from an illumination angle, which corresponds to this raster element, over the object field. This dependency was hitherto understood to be evaluated only as a disruptive effect. This dependency is now used in a targeted manner to provide additional degrees of freedom in a design of a desired course of illumination angle intensity distributions over the object field (a field-dependent optical effect of the illumination optical system on the illumination angles produced). This predetermined desired course generally varies over the position of the object field. The specification or predetermined allocation of an actual tilting angle for each individual mirror by the controller depending on the intended desired intensity course in the pupil plane of the illumination system and depending on the predetermined desired course of illumination angle intensity distributions over the field produces both a predetermined distribution of actual angles of incidence of the illumination light part bundles on the raster elements and simultaneously a predetermined distribution of actual incidence positions or impingement locations of the illumination light part bundles on the raster elements. The controller may be configured so that a first illumination setting (a first illumination angle characteristic) results at, for example, an of the object field perpendicular to a displacement direction of an object to be illuminated (e.g., perpendicular to a scanning direction of a projection exposure system in which the illumination optical system can be used) and a second illumination setting (different from the first illumination setting) results at the opposing edge of the object field. Objects to be imaged arranged in the object field, in particular reticles, can then be imaged with illumination angles between these field edges of different design of the structures to be imaged with high precision and adapted to the respective structural design. An illumination setting can be achieved by impingement of the raster module via the mirror array with a specific local intensity distribution. In this case, one and the same intensity distribution of the impingement of the raster module can then be produced with different entry angle distributions of the illumination light part bundles on the raster module, in other words with different predetermined distributions of actual tilting angles of the individual mirrors or different allocations of the actual tilting angles to the individual mirrors, as a change in the allocation of the individual illumination light part bundles to the raster elements of the raster module can be ensured via a corresponding tilting of the individual mirrors. The illumination optical system according to the disclosure can make use of the aberrations of spherical surfaces of light-guiding raster elements of the raster arrangements of the raster module. A desired variation of the illumination angle characteristic over the object field can therefore be produced by the respectively selected entry angle distribution of the illumination light part bundles on the raster module by corresponding selection of actual tilting angle distributions of the individual mirrors. Compared with the illumination optical system described in WO 2007/093433 A1 stronger field dependencies of the optical effect of the illumination optical system according to the disclosure on the illumination angles produced can be provided. The predetermined distribution or desired distribution of actual tilting angles of the individual mirrors, which are allocated by the controller to the predetermined desired course of the illumination angle intensity distributions, is a distribution of tilting angles to the individual mirrors. The result of this desired distribution is therefore the information for all the individual mirrors as to which of these individual mirrors is to adopt which tilting angle. Groups of individual mirrors may, in this case, have the same tilting angle. With corresponding symmetry of the illumination, groups of this type can be accommodated on sub-units of the mirror array, which are arranged separately from one another.

An arrangement of the raster module can increase a dependency of the emergent angles of the illumination light part bundles, proceeding from the raster module, on the respective angles of incidence of the illumination light part bundles toward the raster module.

The first raster arrangement of a raster module may have raster elements, which are imaged overlapping one another in the object field. The second raster arrangement may produce an emergent angle distribution of the illumination light part bundles, which is directly correlated to a location distribution on the object field.

A size ratio of a diameter of the illumination light part bundle to the total entry or impingement face of the raster element of the second raster arrangement can lead to correspondingly large freedoms during a different bundle influencing of the illumination light part bundles impinging on this raster element at various locations. A size ratio of this type provides the possibility of a strong field-dependent optical effect of the illumination optical system on the illumination angles produced.

A configuration can be designed to keep constant the emergent angles defining field edges of the object field.

Configurations can allow a specification of field dependencies of illumination intensities from specific illumination angles.

The predetermined desired course of illumination angle intensity distributions can be extended to the two dimensions of the object field. This can be used, in particular, when the total object field is imaged simultaneously, in other words not by a scanning method.

The advantages of an adjustment method can correspond to those described above in conjunction with the illumination optical system according to the disclosure.

Production methods can allow a utilisation adapted to the respective boundary conditions of the possible dependencies between the angles of incidence and the impingement locations, on the one hand, and the emergent angles, on the other hand.

The advantages of an optical system, a projection exposure system, a production method and a component can correspond to those described above with reference to the illumination optical system according to the disclosure and the method according to the disclosure.

BRIEF DESCRIPTION OF THE DRAWINGS

Embodiments of the disclosure will be described in more detail below with the aid of the drawings, in which.

DETAILED DESCRIPTION

Figure 1:
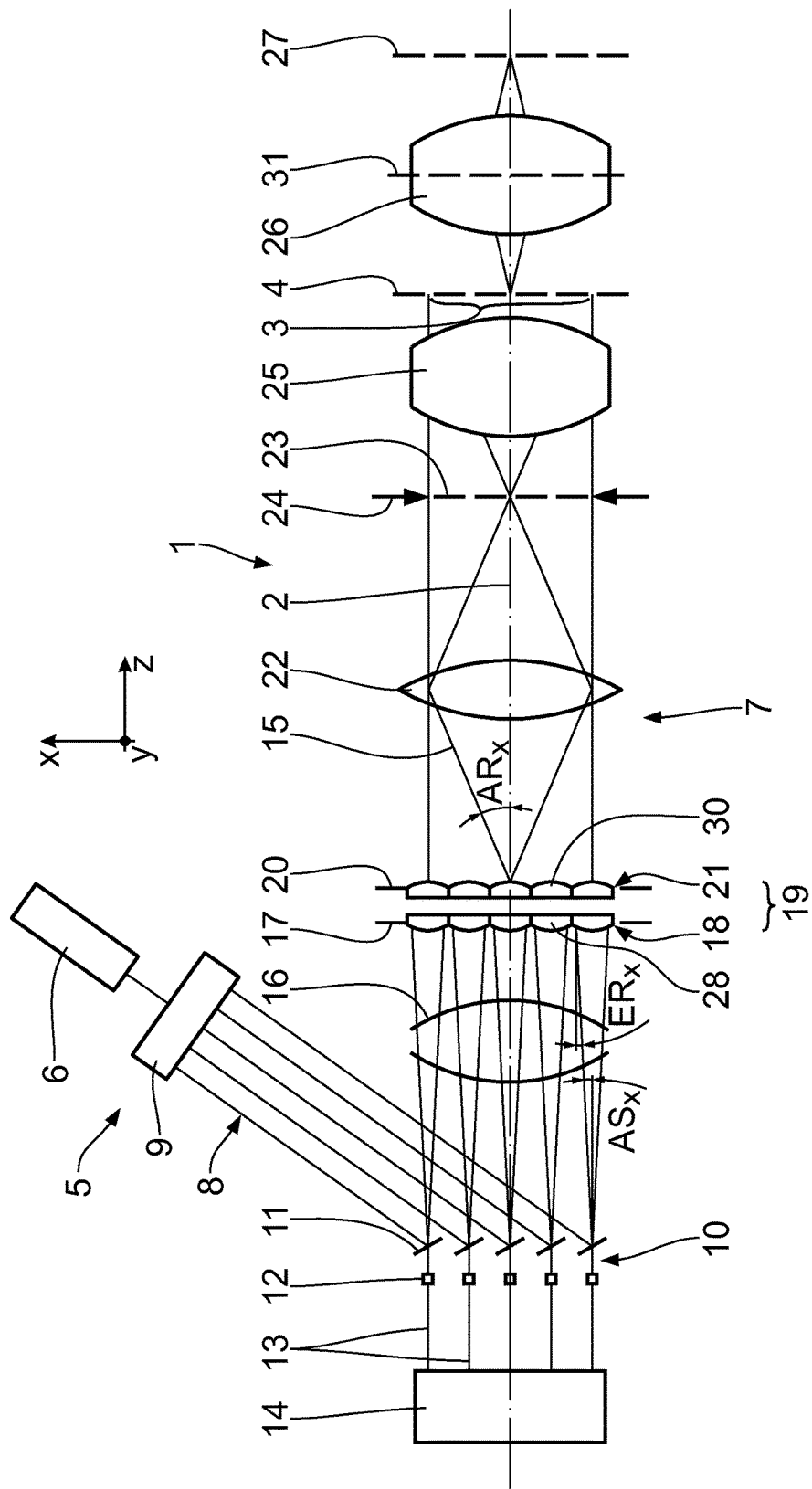
FIG. 1 schematically shows a meridional section through an illumination system according to the disclosure within a microlithography projection exposure system with an illumination optical system with a mirror array with tilting actuators activated by a controller and a raster module with a two-stage raster arrangement.

FIG. 1 schematically shows a microlithography projection exposure system 1, which is designed as a wafer scanner and is used in the production of semiconductor assembly parts and other finely structured components. The projection exposure system 1 works to achieve resolutions to fractions of micrometres with light, in particular from the deep ultraviolet range (DUV or VUV).

To facilitate the showing of positional relationships, a Cartesian xyz coordinate system is reproduced in the drawing. The x-direction runs upwardly in FIG. 1. The y-direction runs perpendicular to the plane of the drawing in FIG. 1 and out of it. The z-direction runs to the right in FIG. 1.

A scanning direction of the projection exposure system 1 runs in the y-direction, in other words perpendicular to the plane of the drawing in FIG. 1. In the meridional section shown in FIG. 1, the plurality of optical components of the projection exposure system 1 is arranged in a row along an optical axis 2 running in the z-direction. It is obvious that convolutions of the optical axis 2 other than shown in FIG. 1 are possible, in particular in order to make the projection exposure system 1 compact.

An illumination system designated as a whole by 5 of the projection exposure system 1 is used for the defined illumination of an object or illumination field 3 in an object or reticle plane 4, in which a structure to be transferred in the form of a reticle, not shown in more detail, is arranged. The illumination system 5 includes a primary light source 6 and an illumination optical system 7 with the optical components for guiding illumination or imaging light 8 to the object field 3. The primary light source 6 is an ArF laser with a working wavelength of 193 nm, the illumination light beam of which is oriented coaxially with respect to the optical axis 2. Other UV light sources, for example an $F_2$ excimer laser with a 157 nm working wavelength, a KrF excimer laser with a 248 nm working wavelength and primary light sources with larger or smaller working wavelengths are also possible.

A beam of illumination light 8 coming from the light source 6 with a small rectangular cross section initially impinges on a beam widening optical system 9, which produces an exiting beam of the illumination light 8 with substantially parallel light and a larger rectangular cross section. The beam widening optical system 9 may contain elements which reduce undesired effects of the coherence of the illumination light 8. The illumination light 8 substantially parallelised by the beam widening optical system 7 then impinges on a micro mirror array (Multi Mirror Array, MMA) 10 to produce an illumination light angle distribution. The micro mirror array 10 has a large number of rectangular individual mirrors 11 arranged in an xy-raster. Each of the individual mirrors 11 is connected to an associated tilting actuator 12. Each of the tilting actuators 12 is connected by a control line 13 to a controller 14 to activate the actuators 12. The actuators 12 can be actuated independently of one another by the controller 14. Each of the actuators 12 can adjust a predetermined x-tilting angle (tilting in the xz-plane) and, independently thereof, a y-tilting angle (tilting in the yz-plane) of the individual mirror 11, so that an angle of reflection $AS_x$ of an illumination light part bundle 15 reflected by the associated individual mirror 11 can be predetermined in the xz-plane and, accordingly, an angle of reflection $AS_y$, not shown in the drawing, can be predetermined in the yz-plane.

The angle distribution produced by the MMA 10 of angles of reflection AS of the illumination light part bundles 15 is transformed when passing through a Fourier lens arrangement or a capacitor 16, which is positioned at the spacing of its focal length from the MMA 10, into a two-dimensional, location-dependent illumination light intensity thus distribution perpendicular to the optical axis 2. The intensity distribution thus produced is therefore present in a first illumination plane 17 of the illumination system 5. Together with the Fourier lens arrangement 16, the MMA 10 is thus a light distribution device to produce a two-dimensional illumination light intensity distribution.

Arranged in the region of the first illumination plane 17 is a first raster arrangement 18 of a raster module 19, which is also called a honeycomb capacitor. Angles of incidence $ER_x$ in the xz-plane (cf FIG. 1) and $ER_y$ in the yz-plane (not shown in the drawing) of the illumination light 8 on the raster module 19 are correlated to the angles of reflection $AS_x$ (cf FIG. 1), $AS_y$ (not shown in the drawing) of the illumination light part bundles 15 from the MMA 10 and/or the location, from which the respective illumination light part bundle 15 is emitted from the MMA 10, in other words the respective individual mirror 11. This correlation is predetermined by the Fourier lens arrangement 16. When using a Fourier lens arrangement 16, in other words not a capacitor, the impingement locations of the illumination light part bundles 15 on the first raster arrangement 18 are directly correlated to the angles of reflection $AS_x$, $AS_y$ of the illumination light part bundles 15 from the MMA 10, as on the raster arrangement 18, the angles of reflection are $AS_x$ and $AS_y$, as the Fourier lens arrangement 16 approximately leads to a conversion of angles into location coordinates. Both when using a Fourier lens arrangement 16 and when using a capacitor 16, the angles of incidence $ER_x$, $ER_y$ of the illumination light part bundles 15 on the raster module 19 are directly correlated with the positions of the illumination light part bundles 15 on the MMA 10, in other words with the individual mirror 11, from which the respective illumination light part bundle 15 is emitted, as both the use of a Fourier lens arrangement 16 and the use of a capacitor 16 leads to a conversion of location coordinates into angles.

The raster module 19 is used to produce a spatially distributed arrangement of secondary light sources, in other words of images of the primary light source 6 and therefore to the production of a defined illumination angle distribution of the illumination light leaving the raster module 19.

A second raster arrangement 21 is arranged in a further illumination plane 20. The illumination plane 17 is in or close to a front focal plane of individual elements of the second raster arrangement 21. The two raster arrangements 18, 21 are a honeycomb capacitor of the illumination optical system 7. The further illumination plane 20 is a pupil plane of the illumination system 5 or is adjacent to a pupil plane of the illumination system 5. The raster module 19 is therefore also designated the field-defining element (FDE).

The emergent angles $AR_x$ in the xz-plane (cf. FIG. 1) and $AR_y$ in the yz-plane (not shown in the drawing), at which the illumination light part bundles 15 leave the second raster arrangement 21, are precisely allocated to a location region in the object field 3, on which the respective illumination light part bundle 15 impinges on the object field 3.

Arranged downstream of the raster module 19 is a further capacitor 22, which is also called a field lens. Together with the second raster arrangement 21, the capacitor 22 images the first illumination plane 17 in a field intermediate plane 23 of the illumination system 5. A reticle marking system (REMA) 24, which is used as an adjustable shading mask to produce a sharp edge of the illumination light intensity distribution, may be arranged in the field intermediate plane 23. A following lens system 25 images the field intermediate plane 23 on the reticle, in other words, the lithography master, which is located in the reticle plane 4. Using a projection lens system 26, the reticle plane 4 is imaged on a wafer or image plane 27 on the wafer, not shown in FIG. 1, which is intermittently or continuously displaced in the scanning direction (y).

The first raster arrangement 18 has individual first raster elements 28, which are arranged column-wise and line-wise in the xy-plane. The first raster elements 28 have a rectangular aperture with an x/y aspect ratio of, for example, 1/1. Other, in particular greater x/y-aspect ratios of the first raster elements 28, for example 2/1, are possible.

The meridional section according to FIG. 1 runs along a raster column. The first raster elements 28 are configured as microlenses, for example with a positive refractive power. The first raster elements 28 are arranged directly adjacent to one another in a raster corresponding to their rectangular shape, in other words, substantially filling the area. The first raster elements 28 are also called field honeycombs.

The raster construction and the function of the raster module 19 basically correspond to that which is described in WO2007/093433 A1.

Figure 2:
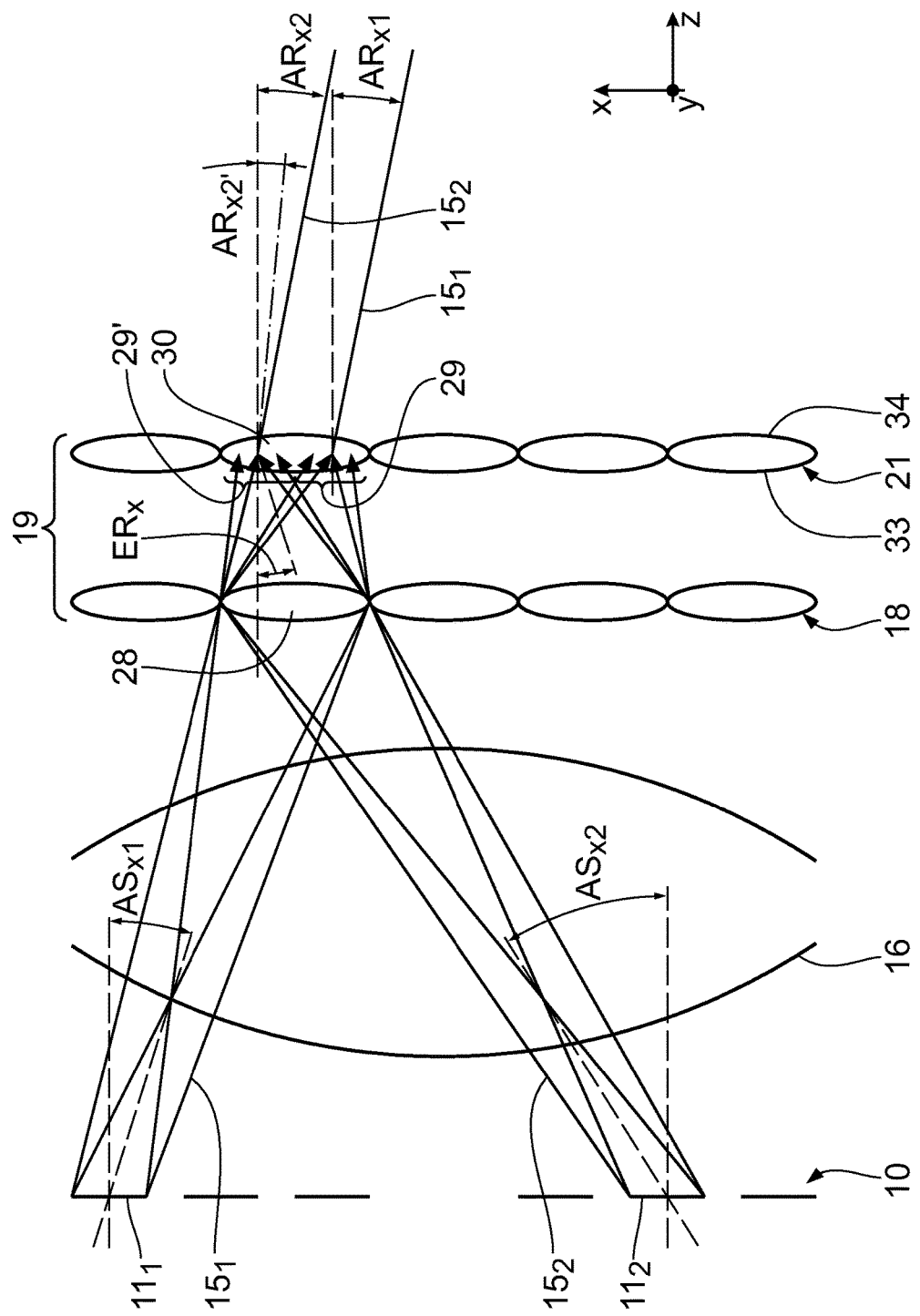
FIG. 2 shows a detail of the illumination optical system according to FIG. 1 with a variant of a guidance of illumination light part bundles between the mirror array and the raster module.

FIG. 2 illustrates a course of two illumination light part bundles $15_1$ and $15_2$ from the MMA 10 to the second raster arrangement 21 of the raster module 19. A central angle of reflection, angle of incidence or emergent angle of the respective illumination light part bundle 15 is always shown. Angles of reflection $AS_x$ of two illumination light part bundles 15 from the MMA 10, an angle of incidence $ER_x$ of one of the two illumination light part bundles 15 on the second raster arrangement 21 (the corresponding central angle of incidence of the other illumination light part bundle is zero) and emergent angles $AR_x$ of the illumination light part bundles 15 from the raster module 19 are shown by way of example in FIG. 2.

No refractive effect of the Fourier lens arrangement 16 is shown in a simplified manner in FIG. 2. In fact, a refractive effect of this type is present, such that an angle of reflection $AS_x$ of the illumination light part bundles 15 from the MMA 10 does not coincide with the respective angle of incidence $ER_x$ of the illumination light part bundles 15 on the first raster arrangement 18. With the refractive effect of the Fourier lens arrangement 16, a correlation of the angle of reflection $AS_x$ of the respective illumination light part bundle 15 from the MMA 10 and of the location, from which the respective illumination light part bundle 15 is emitted from the MMA 10, to the angle of incidence $ER_x$ of the same illumination light part bundle 15 on the first raster arrangement 18 is provided.

Components which correspond to those which were discussed above with reference to the figures already described, have the same reference numerals and will not be described again in detail.

The illumination light part bundle $15_1$ shown at the top in FIG. 2 is guided from the individual mirror $11_1$ of the MMA 10 shown right at the top in FIG. 2 at an angle of reflection $AS_{x1}$ via the Fourier lens arrangement or the capacitor 16 to the first raster element 28, shown as second from the top, of the first raster arrangement 18 of the raster module 19. The illumination light part bundle $15_1$ impinges at an angle of incidence on the first raster arrangement 18, which is only the same as the angle of reflection $AS_{x1}$ in the view of FIG. 2 disregarding the refractive effect of the Fourier lens arrangement 16. After passing through this first raster arrangement 28, the illumination light part bundle $15_1$ impinges on a first location region 29 of a second raster element 30 of the second raster arrangement 21. This first location region 29 corresponds to the diameter of the illumination light part bundle $15_1$ impinging on the second raster element 30 and predetermines a first impingement location for illumination light on the second raster element 30.

The two raster elements 28, 30 allocated to one another via the light path of the illumination light part bundle $15_1$, on the one hand, of the first raster arrangement 18, and, on the other hand, of the second raster arrangement 21 predetermine an illumination light channel.

A substantially higher number of channels are present in the case of the real raster module 19 than shown in the drawing, for example a few hundred, a few thousand or even a few tens of thousands of channels of this type. The second raster elements 30 of the second raster arrangement 21, in each case allocated to the channels, are arranged in the light path behind the first raster elements 28 of the first raster arrangement 18. The second raster elements 30 are also configured as microlenses with, in particular, a positive refractive power. The second raster elements 30 are also called pupil honeycombs, which are arranged in the second illumination plane 20, in other words in a pupil plane of the illumination optical system 7. The second illumination plane 20 is conjugated to a pupil plane 31 of the projection lens system 26. The second raster elements 30, together with the field lens 22, image the first raster elements 28 arranged in the second illumination plane 17, in other words the field honeycombs, in the field intermediate plane 23. The images of the first raster elements 28 are thus superimposed in the field intermediate plane 23.

FIG. 1 shows the raster elements 28, 30 schematically as plano-convex lenses. In further figures of the drawings, the raster elements 28, 30 are also schematically shown as biconvex lenses.

The second illumination light part bundle $15_2$ shown in FIG. 2 is guided from the individual mirror $11_2$ of the MMA 10, shown as the second from the bottom, to the same first raster element 28 as the first illumination light part bundle $15_1$ shown in FIG. 2. An angle of reflection $AS_{x2}$ of the illumination light part bundle $15_2$ from the individual mirror $11_2$ has the opposite sign to the angle of reflection $AS_{x1}$ of the illumination light part bundle $15_1$ in the view according to FIG. 2 disregarding the refractive effect of the Fourier lens arrangement 16.

Taking into account the refractive effect of the Fourier lens arrangement 16, the angle of reflection $AS_{x2}$ of the illumination light part bundle $15_2$ from the individual mirror $11_2$ may be approximately identical to the angle of reflection $AS_{x1}$ of the illumination light part bundle $15_1$ if these impinge upon the same raster element 28 of the first raster arrangement 18. Because of the fact that the illumination light part bundles $15_1$, $15_2$ are emitted from different locations from the MMA 10, in other words from different individual mirrors 11, and therefore impinge at different locations on the Fourier lens arrangement 16, a difference is then nevertheless produced between the two angles of incidence of the illumination light part bundles $15_1$, $15_2$ on the first raster arrangement 18. This situation, in which the same angles of incidence of various illumination light part bundles $15_1$, $15_2$ are transferred to the Fourier lens arrangement 16 at different emergent angles, is not shown in FIG. 2, as already mentioned.

After passing through the first raster element 28, the second illumination light part bundle $15_2$ impinges on a second location region 29' of the same second raster element 30 as the first illumination light part bundle $15_1$. The second location region 29' specifies an impingement location of the second illumination light part bundle $15_2$ on this second raster element 30. The two location regions 29 and 29', in which the two illumination light part bundles $15_1$, $15_2$ impinge on the second raster element 30, are spatially separated from one another in the embodiment shown. Alternative embodiments are possible, in which the location regions 29 and 29', in which the two illumination light part bundles $15_1$, $15_2$ impinge on the second raster element 30, partially overlap one another.

FIG. 2 illustrates two alternatively possible effects of the second raster arrangement 21 and the second raster element 30: in a first bundle guidance shown by a continuous line in FIG. 2, the same emergent angles $AR_{x1}$, $AR_{x2}$ results for the two illumination light part bundles $15_1$, $15_2$ being emitted from the second raster element 30. In this case, the emergent angle $AR_x$ is independent of the impingement location 29 or 29' of the respective illumination light part bundle on the second raster element 30. In an alternative optical effect, shown by dash-dot lines in FIG. 2, of the second raster arrangement 21, the emergent angle $AR_{x2}$ for the illumination light part bundle $15_2$ is smaller than the emergent angle $AR_{x1}$ for the illumination light part bundle $15_1$. In this case, the angle of reflection $AR_x$ thus depends on the impingement location 29 on the second raster element 30. Accordingly, the emergent angle $AR_x$ can also depend on an angle of incidence $ER_x$ of the respective illumination light part bundle 15 on the second raster element 30 of the second raster arrangement 21. This angle of incidence $ER_x$ is shown by way of example in FIG. 2 for the illumination light part bundle $11_2$. A corresponding dependency is present between the angle of incidence $ER_x$ of the respective illumination light part bundle 15 on the first raster element 28 of the first raster arrangement 18 and the emergent angle $AR_x$. The second raster elements 30 are often configured in such a way that the emergent angle $AR_x$ depends on a combination of the angle of incidence $ER_x$ and the impingement location 29 on the second raster element 30.

The impingement location or location region 29 (or 29', cf FIG. 2) will also be called AO below.

The surface design of an entry face 33 and/or an exit face 34 of the second raster elements 30 of the second raster arrangement 21 of the raster module 19 can be designed in such a way that for specific emergent angles $AR_x$, this emergent angle is identical for specific combinations of the impingement location of the illumination light part bundle 15 on the second raster element 30 and the angle of incidence $ER_x$ of the illumination light part bundle 15 on this second raster element 30, while for other exit angles, $AR_x$ is in turn dependent on the impingement location and/or on the angle of incidence $ER_x$. This can be used, on the one hand, to sharply define the field edges of the object field 3 and, on the other hand, to predetermine an intensity distribution of specific illumination directions on the object field 3, as will be described below.

The entry faces 33 and/or the exit faces 34 of the raster elements 30 may be spherical, aspherical and, in particular conical in design.

The controller 14 is configured in such a way that a predetermined distribution of actual tilting angles of the individual mirrors 11 of the MMA 10 and, as a result, a predetermined distribution of actual angles of incidence $ER_x$, $ER_y$ of the illumination light part bundles 15 on the first raster elements 28 is allocated to a predetermined desired course of illumination angle intensity distributions, with which object field points over the object field 3 are impinged upon.

This will be described in more detail below with the aid of FIGS. 3 and 4. The MMA 10 is shown there with individual mirrors 11, which are arranged next to one another at an angle, which differs from the zero, with respect to the x-axis. Otherwise, the MMA 10 according to FIGS. 3 and 4 corresponds to the MMA 10 according to FIG. 1. Components, which correspond to those, which were discussed above with reference to the figures already described, have the same reference numerals and will not be described again in detail.

Figure 3:
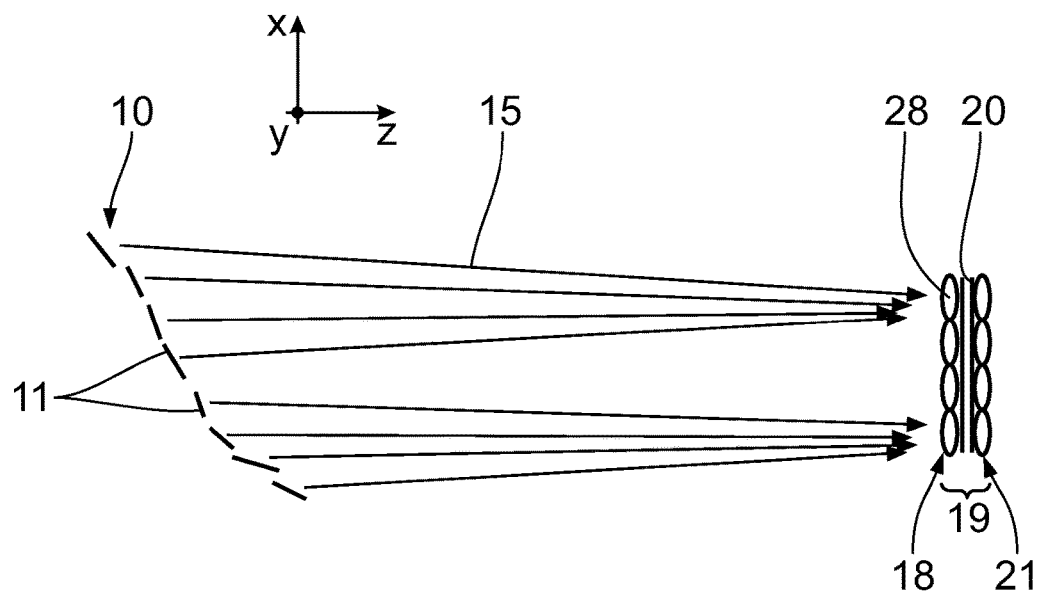
FIGS. 3 and 4 show two variants of an illumination of the raster module with illumination light part bundles, which are deflected by individual mirrors of the mirror array and lead to the same illumination light intensity distribution in an illumination plane of the raster module, which can coincide with a pupil plane of the illumination optical system.
Figure 4:
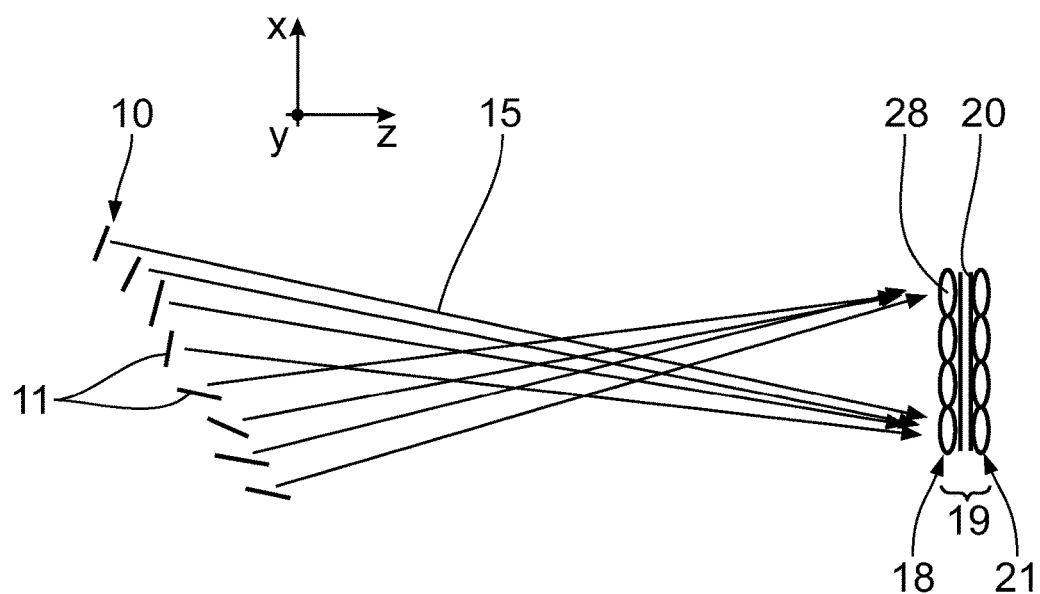

The Fourier lens arrangement or the capacitor 16 between the MMA 10 and the raster module 19 is left out in the schematic FIGS. 3 and 4. In accordance with that which was described above in conjunction with FIG. 2, no refractive effect of this Fourier lens arrangement 16 is drawn in either in the schematic FIGS. 3 and 4. That which was described above in conjunction with FIG. 2 applies to this refractive effect. In reality, it is thus not the case that the angles of reflection of the illumination light part bundles 15 from the MMA 10 coincide with the angles of incidence of the illumination light part bundles 15 on the raster module 19.

Alternative illuminations for the raster module 19, which are shown in FIGS. 3 and 4, in the second illumination plane 20, produce a quadrupole intensity distribution. In other words, four pupil or intensity spots $I_1$ to $I_4$ are thus illuminated in the pupil plane 31 and are shown in FIG. 5, and are numbered consecutively beginning with the intensity spot $I_1$ shown uppermost in the anti-clockwise direction.

FIG. 3 shows a first distribution of actual tilting angles of the individual mirrors, which leads to a corresponding distribution of actual angles of incidence $ER_x$ of the illumination light part bundles 15 on the first raster elements 28 of the first raster arrangement 18 of the raster module 19.

The actual tilting angle distribution according to FIG. 3 leads to minimal angles of incidence $ER_x$, $ER_y$ of the illumination light part bundles 15 on the first raster elements 28 of the raster module 19 and as a result leads to the fact that everywhere in the object field 3, in other words independently of the field, the four illumination directions, which correspond to the intensity spots $I_1$ to $I_4$, are represented with the same intensity of the illumination light.

Figure 5:
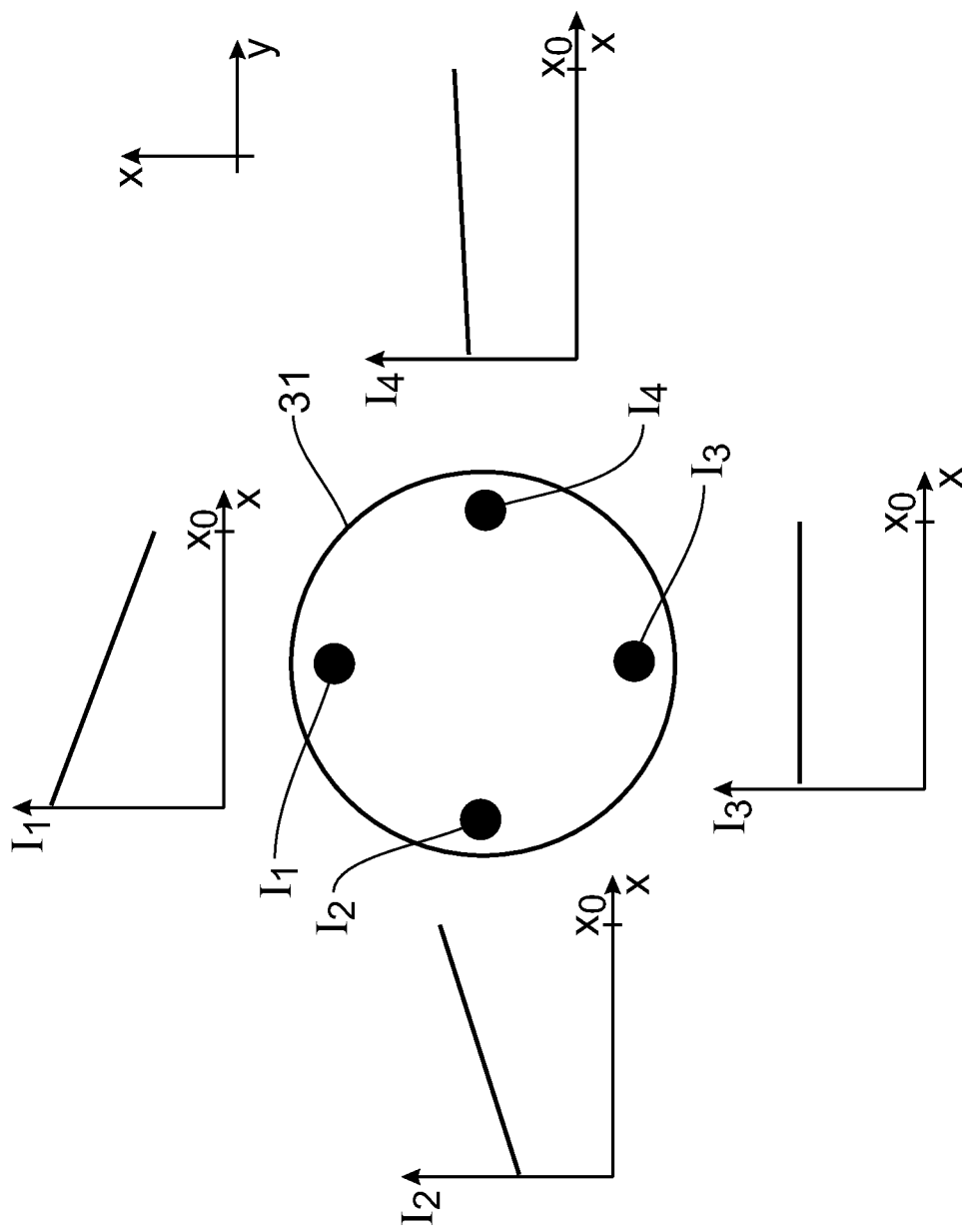
FIG. 5 in each case schematically shows the field dependency of an illumination light intensity from four excellent illumination directions, shown by intensity spots in the pupil plane.

FIG. 4 shows a variant of a distribution of actual tilting angles of the individual mirrors 11 of the MMA 10, which also leads to the quadrupole illumination setting with the four intensity spots (poles) $I_1$ to $I_4$ according to FIG. 5, but with a different distribution of actual angles of incidence $ER_x$, $ER_y$ of the illumination light part bundles 15 on the first raster elements 28 of the raster module 19. The actual tilting angel distribution according to FIG. 4 is such that, in comparison to FIG. 3, substantially greater angles of incidence $ER_x$, $ER_y$ result. The raster elements 28, 30 impinged upon by the illumination light part bundle 15 in the illumination according to FIGS. 3 and 4 are configured such that the increase in the angle of incidence in the actual angle of incidence distribution according to FIG. 4 can lead to a tilting of the illumination angle intensities I(x) from the direction of the four intensity spots $I_1$ to $I_4$ over the object field 3. The effect on which this tilting is based is described in WO 2007/093433 A1, where this tilting was produced via an additional illumination angle variation device of the raster module, in other words not via an MMA. An actual course of illumination angle intensity distributions resulting on the basis of the actual angle of incidence distribution according to FIG. 4, with which object field points are impinged upon over the object field, is shown in FIG. 5 for the four illumination directions $I_1$ to $I_4$ of the quadrupole illumination setting there. Only a part of the illumination light part bundles 15 is drawn in FIG. 4, which lead to the field dependency according to FIG. 5. The I(x)-graph shown at the top in FIG. 5 shows the dependency of an intensity from the direction of the $I_1$-pole over the field coordinates x. The tilt is adjusted in such a way that the intensity falls away linearly from the left field edge (x=0) to the right field edge (x=$x_0$).

The corresponding field dependency of the illumination intensity from the direction of the pole $I_2$ is shown on the left in FIG. 5. The $I_2$-intensity increases linearly, proceeding from the left field edge to the right field edge.

The I(x)-dependency for the $I_3$-pole is shown at the bottom in FIG. 5. The intensity $I_3(x)$ from the direction of the $I_3$-pole is independent in relation to the field coordinates (x).

The $I_x$-dependency for the illumination intensity from the direction of the $I_4$-pole is shown on the right in FIG. 5. The illumination intensity $I_4(x)$ from the direction of the $I_4$-pole rises proceeding from the left field edge to the right field edge with a slope which is smaller in comparison to the slope of the dependency $I_2(x)$.

Depending on the design of the refractive effects of the first raster elements 28 and the second raster elements 30, a large bandwidth of other desired courses of illumination angle intensity distributions, with which object field points are impinged upon over the object field, can be predetermined. A desired distribution of angles of incidence $ER_x$, $ER_y$ of the illumination light part bundles 15 on the raster elements 28 of the raster module 19 is then firstly determined for the predetermined desired course, during the adjustment of the illumination optical system 7 to prepare the operation of the projection exposure system 1. A distribution of desired tilting angles of the individual mirrors 11 is then allocated to this determined desired angle of incidence distribution. A desired tilting angle is therefore predetermined for each individual mirror 11. Finally, the tilting actuators 12 of the individual mirrors 11 are activated in such a way that the actual tilting angles of the individual mirrors 11 coincide with the associated desired tilting angles.

A degree of dependency of the desired course I(x) of the illumination angle intensity distributions, with which the object field points are impinged upon over the object field 3, on the distribution of actual angles of incidence $ER_x$, $ER_y$ of the illumination light part bundles 15 on the first raster elements 28 or $ER_x$, $ER_y$ on the second raster elements 30 can be influenced by the positional relationship of the two raster arrangements 18, 21 of the raster module 19 with respect to the at least one pupil plane of the illumination optical system 7. Depending on whether, for example, the second illumination plane 20 coincides with a pupil plane of the illumination optical system 7 or whether a defined spacing is present between the second illumination plane 20 and the pupil plane of the illumination optical system 7, a weaker or stronger dependency of the desired course of illumination angle intensity distributions on the actual angle of incidence $ER_x$ may result.

Depending on the specification of an actual tilting angle distribution of the individual mirrors 11 of the MMA 10, predetermined intensity distributions of the illumination light part bundles 15 on the raster module 19 and correspondingly predetermined intensity distributions in the pupil plane 31 may result. A further example to supplement the quadrupole intensity distribution described above in conjunction with FIGS. 3 to 5 is a dipole intensity distribution, in which two pupil or intensity spots are illuminated in the pupil plane 31, the position of which may correspond to that of the intensity spots $I_1$ and $I_3$ in the view according to FIG. 5.

The ratios in the guidance of an illumination light part bundle 15 with the two raster elements 28, 30, allocated to a light channel, of the raster arrangements 18, 21 of the raster module 19 will be described in detail below with the aid of FIGS. 6 to 8. The raster elements 28, 30 are in turn shown as plano-convex lenses in FIGS. 6 to 8. These may just as well be biconvex lenses.

Components which correspond to those which were discussed above with reference to the already described figures, have the same reference numerals and will not be described again in detail.

Figure 6:
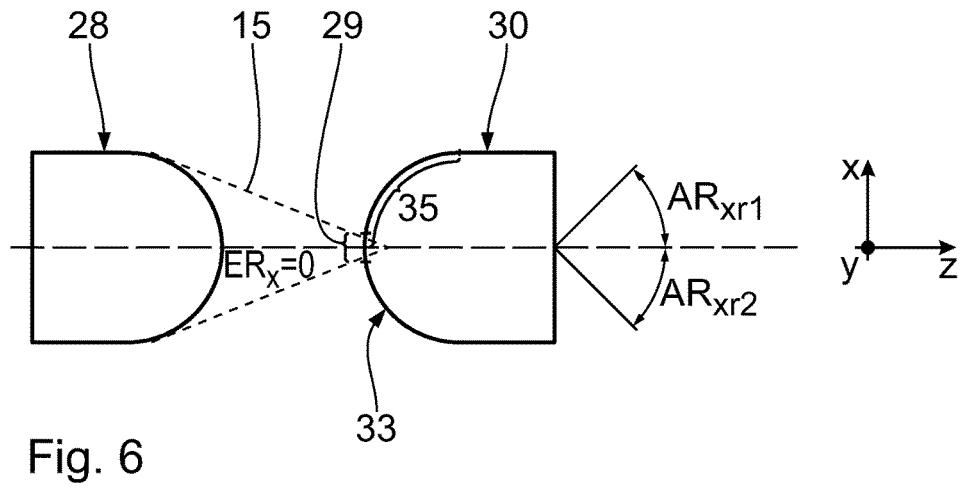
FIG. 6 shows, in an enlarged manner, a raster element of the first raster arrangement of the raster module and an associated raster element of the second raster arrangement of the raster module and a bundle course of the illumination light part bundle guided by these two raster elements at a first angle of incidence of the illumination light part bundle on the first raster element.

During the guidance of the illumination light part bundle 15 according to FIG. 6, the latter impinges at an angle of incidence $ER_x$=0 on the second raster element 30. In the xz-plane shown, the course of the illumination light part bundle 15 focused between the raster elements 28 and 30 is symmetrical to the z-axis. The location region 29, in other words the diameter of the illumination light part bundle 15, is smaller than one half 35 of the total entry face 33 of the second raster element 30. Another area-size ratio between the location region 29 and the total entry face 33 is also possible.

Figure 7:
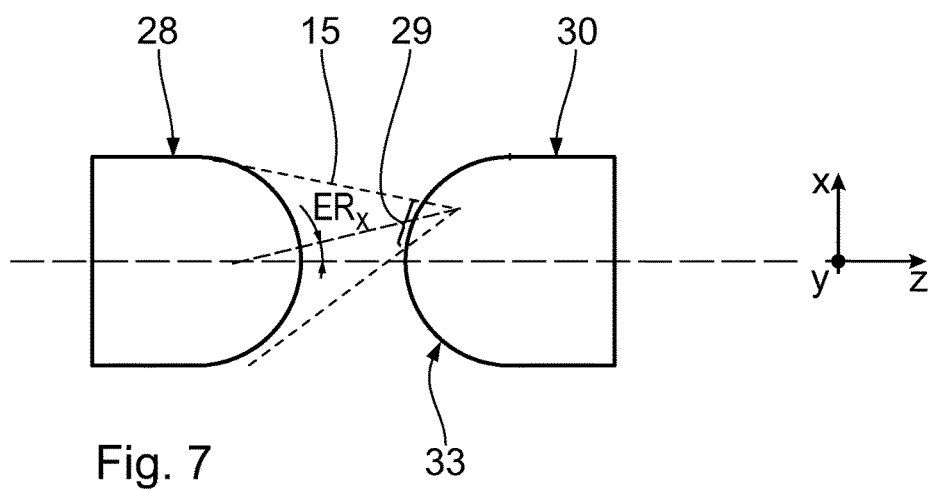
FIGS. 7 and 8 show views similar to FIG. 6 of the two raster elements and the illumination light part bundle at further angles of incidence of the illumination light part bundle on the first raster element.

FIG. 7 shows a variant of a guidance of the illumination light part bundle 15 at an angle of incidence $ER_x$ on the second raster element 30 in the order of magnitude of 15°. The impingement location 29 of the illumination light part bundle 15, in the bundle guidance according to FIG. 7, lies completely in a half-plane located above the z-axis, in other words an axis of symmetry of the raster elements 28, 30.

Figure 8:
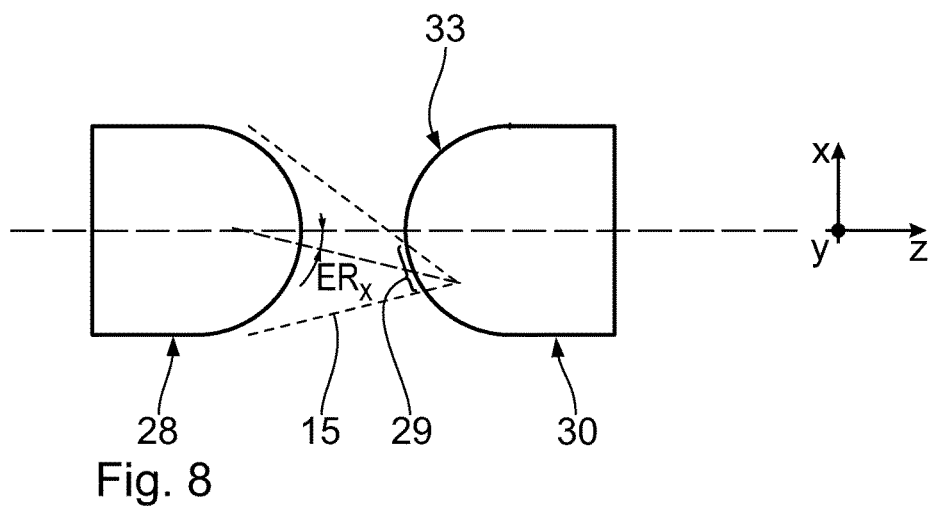

FIG. 8 shows a further variant of a bundle guidance of the illumination light part bundle 15 at an angle of incidence $ER_x$ on the second raster element 30 with an opposite sign in comparison to the situation according to FIG. 7, but the same absolute size. The impingement location 29 of the illumination light part bundle 15 on the entry face 33 of the second raster element 30, in the bundle guidance according to FIG. 8, lies completely in the half-plane located below the z-axis.

In comparison to the bundle guidances according to FIGS. 7 and 8, the impingement locations 29 there, in other words the diameters of the illumination part bundle 15, which impinges on the second raster element 30, are completely separate from one another. A characteristic of a dependency of the emergent angle $AR_x$ of the illumination light part bundle 15 from the second raster element 30 on the angle of incidence $ER_x$, which is shown in FIGS. 6 to 8, can therefore be influenced by a suitable design of the entry face 33 of the second raster element 30.

Figure 9:
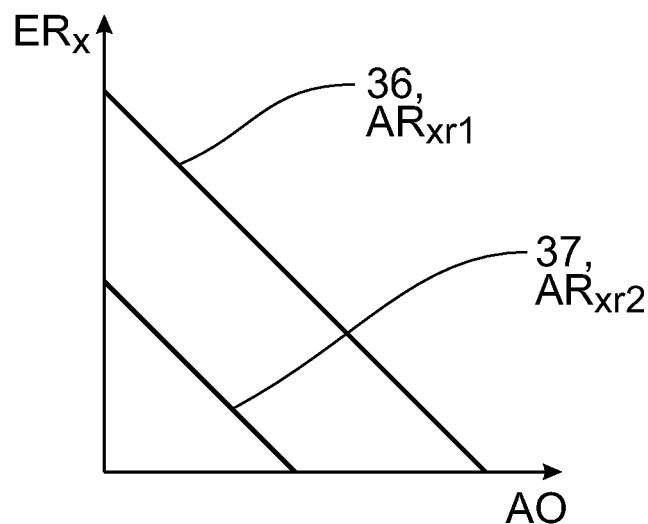
FIG. 9 shows, in a graph, isolines for those pairs of parameters (angle of incidence of the illumination light part bundle on the second raster element; impingement location of the illumination light part bundle on the second raster element), which lead to the same emergent angles defining the field edges of the illumination light part bundles from the second raster element.

FIG. 9 schematically shows a dependency of emergent angles $AR_x$, proceeding from the raster module 19, on the one hand on the angle of incidence $ER_x$ on the respective second raster element 30 and, on the other hand, on the impingement location AO of the respective illumination light part bundle 15 on the second raster element 30. Illumination light part bundles 15, which run through a respective edge of the first raster element 28, in each case form a straight line in FIG. 9. The edges of the first raster element 28 are imaged on the field edges of the object field 3. Isolines of two emergent angles $AR_{xr1}$ and $AR_{xr2}$, which define the two opposing x-field edges of the object field 3, are therefore produced in FIG. 9. One field edge emergent angle $AR_{xr1}$ is produced in each case for a given parameter pair ($ER_x$; AO) and the other field edge emergent angle $AR_{xr2}$ is produced for another linear course of parameter pairs ($ER_x$; AO). This course of the parameter pairs is also called isolines 36, 37 for the field edge emergent angles $AR_{xr1}$, $AR_{xr2}$.

If the parameter pair condition according to the isolines 36, 37 according to FIG. 9 is adhered to, the same emergent angle $AR_{xr1/2}$ always results, so the field edges of the object field 3 in the x-direction, in other words the left field edge in the x-direction and the right field edge in the x-direction of the object field 3, remain sharply defined. In practice, the parameter pair dependencies do not have to run linearly, as shown in FIG. 9, but may also have a different course. The linear course shown in FIG. 9 may lead to a homogenous illumination of the object field at the field edges.

Figure 10:
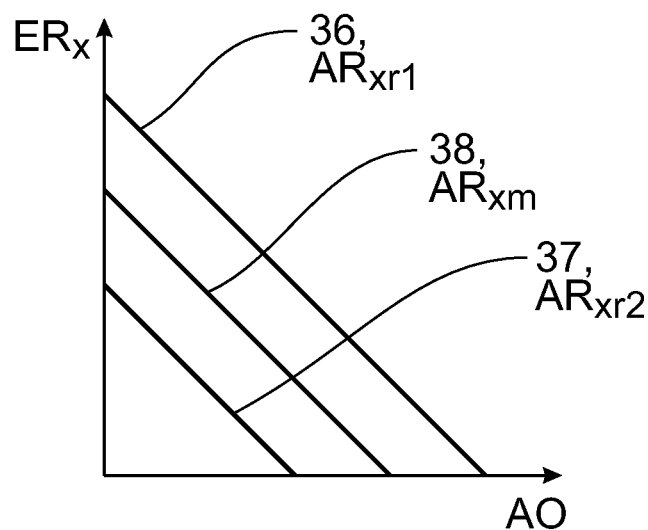
FIG. 10 shows a graph similar to FIG. 9, which additionally shows an isoline for the pair of parameters (angle of incidence; impingement location) for a third emergent angle defining the field centre.

FIG. 10 shows a view corresponding to FIG. 9, a third isoline 38 for a third emergent angle $AR_{xm}$ defining an object field centre in the x-direction also being shown in addition to the isolines 36, 37 for the two field edge emergent angles. The isoline 38 extends equidistantly between the two isolines 36 and 37, which leads to a homogenous illumination of the object field 3 with the illumination light 8.

Figure 11:
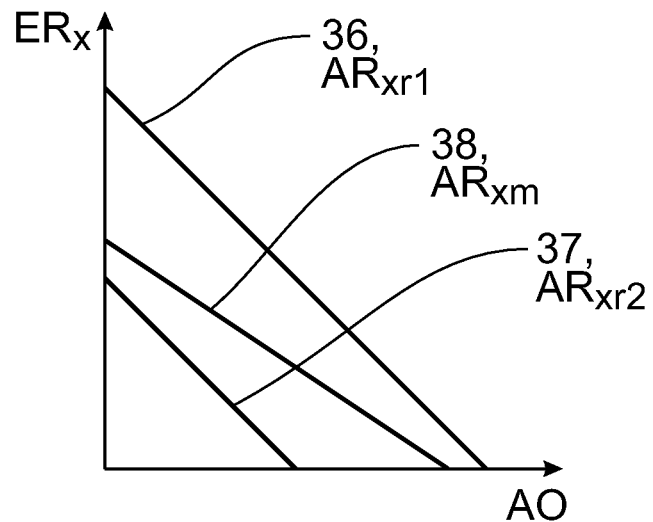
FIGS. 11 and 12 show graphs similar to FIG. 10, which show different courses of the isoline for the pair of parameters of the emergent angle defining the field centre.

FIG. 11 shows a variant of the course of the isoline 38 for the emergent angle $AR_{xm}$ defining the object field centre in the x-direction. At the left edge of the impingement locations AO in FIG. 11, the angles of incidence $ER_x$ for the isolines 37 and 38 are located close together. This means that, the angle of incidence $ER_{xm}$, which leads to the emergent angle $AR_{xm}$ for the object field centre is already located, with regard to the impingement location on the respective second raster element 30 close to the angle of incidence $ER_x$, which leads to the emergent angle $AR_{xr2}$ for, for example, the left edge of the object field 3 in the x-direction. This "left" half of the object field 3, assuming a homogeneous distribution of angles of incidence $ER_x$ on the second raster elements 30, is thus illuminated with a lesser intensity than the right object field half. The conditions at the right edge of the impingement locations AO in FIG. 11, where the two isolines 36 and 38 approach one another, are the reverse. If this region of the impingement locations AO is used, the other object field half is then illuminated with lesser intensity.

Figure 12:
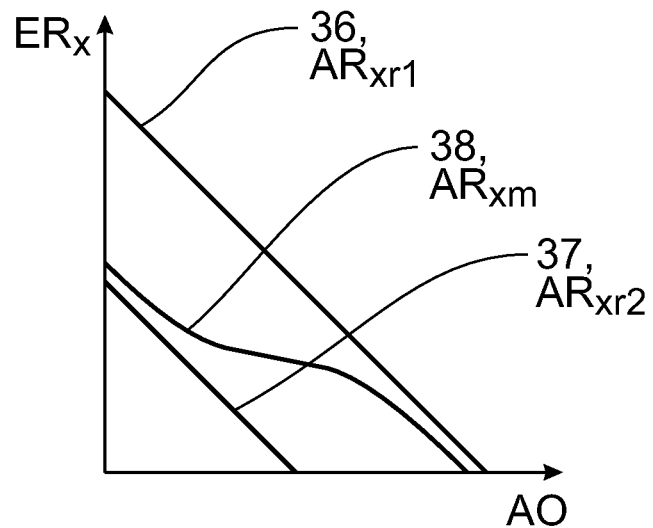

FIG. 12 shows by way of example a further course possibility of the isoline 38 for the emergent angle $AR_{xm}$ defining the object field centre. In the region of central impingement locations AO and angles of incidence $ER_x$, the isoline 38 changes from a course adjacent to the isoline 37 to a course adjacent to the isoline 36. The transition between stronger illumination of the left object field half to a stronger illumination of the right object field half is accordingly more abrupt depending on the respectively used region of the impingement locations. The situation according to FIG. 12 is approximately a limit case, in other words an arrangement, in which the face region 29 on one half of the entry face 33 of the raster element 30 illuminates one half of the object or illumination field 3 and the face region 29 opposing this (cf. FIGS. 6 and 7) on the other half of the entry face 33 of the raster element 30 illuminates the other half of the object or illumination field 3.

Figure 13:
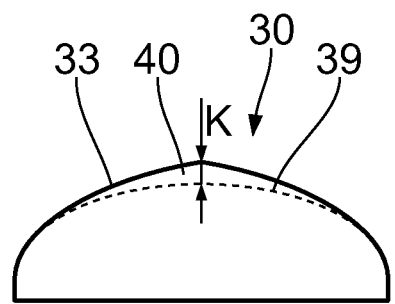
FIG. 13 shows an example of a curvature course of an entry face of a raster element of the second raster arrangement of the raster module.

FIG. 13 shows an example of the structuring of the entry face 33 of one of the second raster elements 30 in order to achieve the limit case mentioned above. A conical contribution 40 is superposed on a spherical basic course 39 of the entry face 33, or an aspherical one with regard to the dependency on the spacing from the optical axis, said basic course being shown by dashed lines in FIG. 13, so the entry face 33 is elevated centrally in the manner of a roof edge. The location of this elevation is illustrated in FIG. 13 by K. The elevation K may be absolutely selected such that owing to the raster element 30 having the elevation K, the incident illumination light part bundle 15 is deflected in the x-direction by half a width of the object field 3, as will be described below with the aid of FIGS. 14 to 16.

Figure 14:
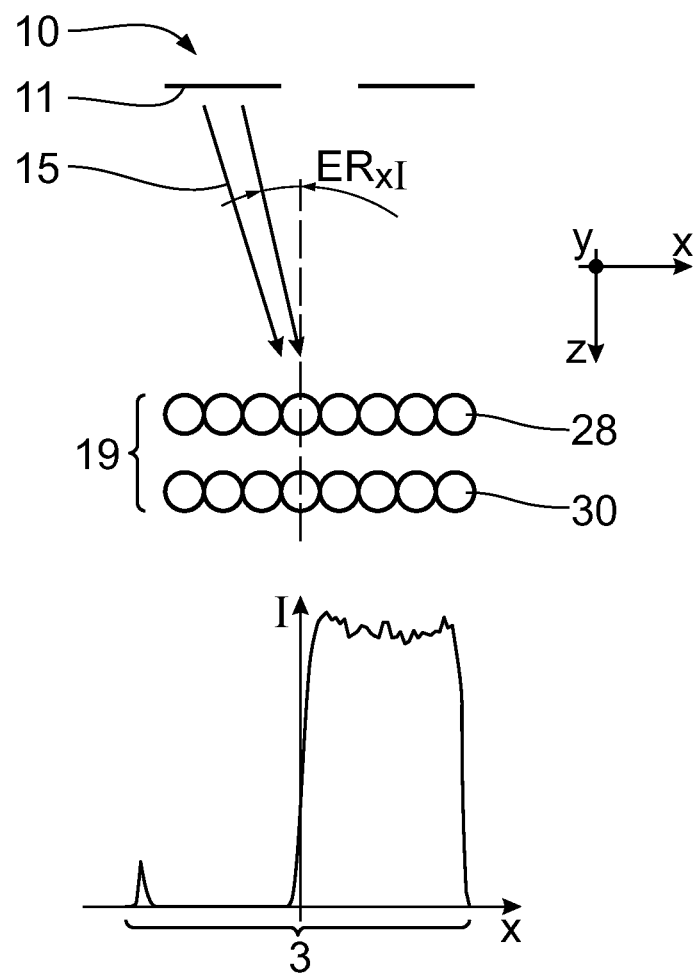
FIGS. 14 to 16 show dependencies of an intensity distribution in an object plane of the illumination optical system on a given illumination of the raster module with illumination light part bundles, the raster module having a second raster arrangement with raster elements with entry faces formed according to FIG. 13.
Figure 15:
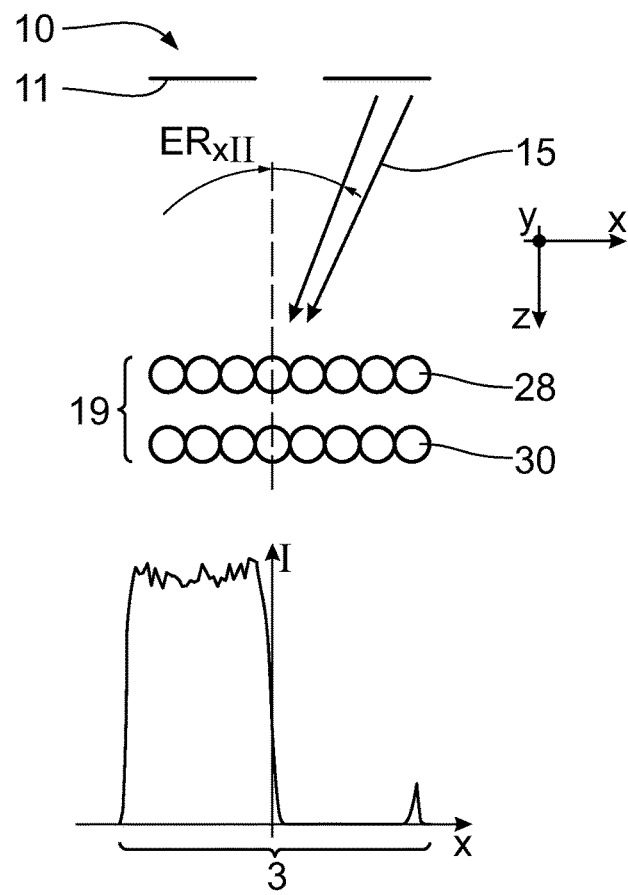
Figure 16:
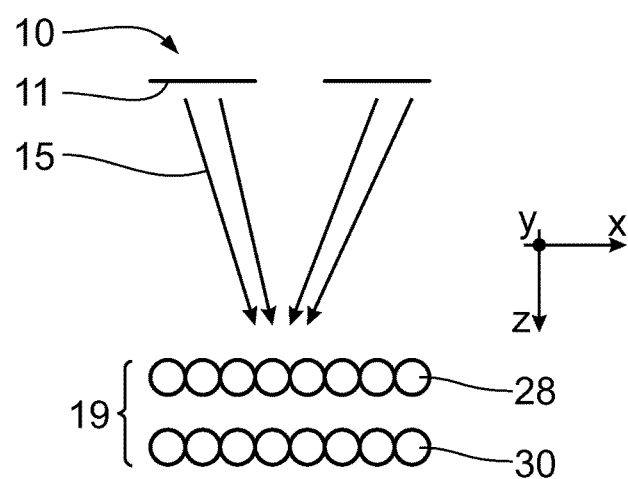

The effect of a raster module 19 with a second raster arrangement 21 with second raster elements 30, the entry faces 33 of which are formed according to the design according to FIG. 13, is illustrated with the aid of FIGS. 14 to 16. FIGS. 14 to 16 in turn show the raster elements 28, 30 as biconvex lenses. The MMA 10 is shown divided into two parts, which are separated from one another. Each of these parts may have a plurality of individual mirrors 11 which can be individually tilted with respect to one another. A subdivision of the MMA 10 into a larger number of parts each with a plurality of individual mirrors 11 is also possible.

Components which correspond to those which were discussed above with reference to the figures already described, have the same reference numerals and will not be described again in detail.

FIG. 14 shows an illumination of the raster module 19 in the xz-plane from incidence directions with first angles of incidence $ER_{xI}$. In the view according to FIG. 14, in which the MMA 10 is shown over the raster module 19, this illumination takes place obliquely from the top left. Because of the conical design of the entry face 33 of the illuminated second raster element 30 according to FIG. 13, a displacement is produced of the illumination light part bundle 15 guided by the raster module 19 in the object field 3 to positive x-values, which is shown in the I(x)-graph of FIG. 14 at the bottom. In the illumination according to FIG. 14, only the right object field half thus sees light from the direction of the pupil spot, which corresponds to the illuminated raster elements 28, 30.

FIG. 15 shows the illumination of the same second raster element 30, but now with an angle of incidence $ER_{xII}$ with an opposite sign, in other words obliquely from the top right in the arrangement according to FIG. 15. A displacement results of the illumination light part bundle 15 thus guided in the object field 3 in the negative x-direction, as shown in the I(x)-graph of FIG. 15 at the bottom. In the illumination according to FIG. 15, only the left object field half thus sees light from the direction of the pupil spot, which corresponds to the illuminated raster elements 28, 30.

FIG. 16 shows the combination of the illuminations according to FIGS. 14 and 15. The entire object field is now illuminated from the direction of the illuminated raster elements 28, 30, in other words from the direction of the associated pupil spot. No additional I(x)-graph is shown in FIG. 16. This I(x)-graph is produced form a superposition of the two I(x)-graphs of FIGS. 14 and 15.

To produce the raster module 29 with the second raster arrangement 21 with second raster elements 30 to specify emergent angle dependencies corresponding to those which were described above with reference to FIGS. 9 to 12, a desired dependency AR(ER, AO) of a course of resulting constant emergent angles $AR_x$ of the illumination light part bundles 15 from the second raster elements 30 depending on the impingement location AO of the illumination light part bundles 15 on these raster elements 30 and depending on the angles of incidence $ER_x$ of the illumination light part bundles 15 on these raster elements 30 can be predetermined. The entry faces 33 and optionally also the exit faces 34 of the second raster elements 30 are then structured in such a way that at a predetermined illumination of the raster module 19, an actual dependency of the emergent angle course is produced, which corresponds to the predetermined desired dependency.

In an alternative production method for the raster module 19, classes of desired dependencies AR(ER, AO) of a course of resulting constant emergent angles $AR_x$ of the illumination light part bundles 15 from the second raster elements 30 are determined depending on the impingement location AO of the illumination light part bundles 15 on these raster elements 30 of the second raster arrangement 21 and depending on the angle of incidence $ER_x$ of the illumination light part bundles 15 on these raster elements 30, which can be achieved with typical face designs of the entry faces 33 and/or the exit faces 34 of the second raster elements 30. These classes of desired dependencies AR(ER, AO) may have isoline courses of parameter pairs of angles of incidence $ER_x$ and of impingement locations AO, which lead to the same emergent angles $AR_x$, as described above in conjunction with FIGS. 9 to 12. A desired dependency AR(ER, AO) obtained in one of the classes determined is then predetermined and the entry faces 33 and/or the exit faces 34 of the raster elements 30 of the second raster arrangement 21 are structured in such a way that with a predetermined illumination of the raster module 19, an actual dependency of the course is produced, which corresponds to the predetermined desired dependency within predetermined tolerance limits.

The effect of the raster module 19 on the illumination light part bundles 15 was described above primarily in the xz-plane. Corresponding effects and dependencies are also produced in the yz-plane. This can be used in order to define the y-field edges of the object field 3 and to also predetermine an intensity distribution from the illumination angles predetermined by an illumination setting over the object field 3 in the y-direction. This may, in particular, be used in the case of the configuration of the projection exposure system 1 as a stepper, in which the entire object field 3 is simultaneously, in other words, not by a scanning method, illuminated and imaged.

In the described embodiments, the raster elements 28, 30 are dioptric, in other words refractive raster elements. In principle, the raster elements 28, 30 may also be designed as catoptric, in other words reflective raster elements.

Figure 17:
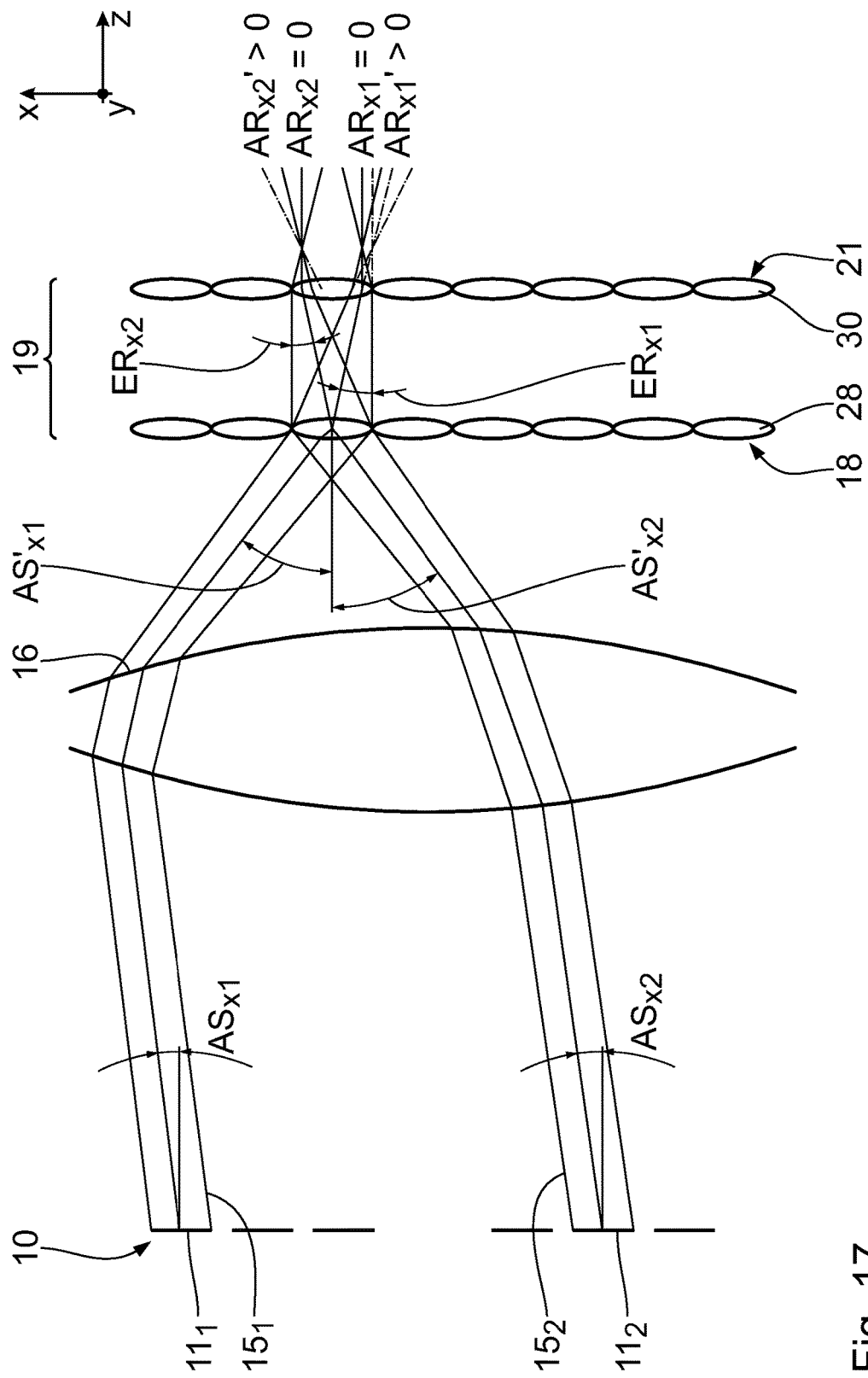
FIG. 17 shows in a view similar to FIG. 2 a detail of the illumination optical system according to FIG. 1, a refractive effect of a Fourier lens arrangement being shown within this detail.

It was already stated above that no refractive effect of the Fourier lens arrangement 16 is shown in a simplified manner in FIG. 2. FIG. 17 shows an arrangement corresponding to FIG. 2, the refractive effect of the Fourier lens arrangement 16 being shown. Components which correspond to those which have already been discussed above with reference to the figures already described and, in particular, with reference to FIG. 2, have the same reference numerals and will not be described again in detail.

The course of two illumination light part bundles $15_1$ and $15_2$ from the respective individual mirrors $11_1$ and $11_2$ of the micro mirror array 10 is in turn shown. The two part bundles $15_1$, $15_2$ have angles of reflection $AS_{x1}$ and $AS_{x2}$ from the individual mirrors $11_1$ and $11_2$. The refractive effect of the Fourier lens arrangement 16 leads to the conversion of these angles of reflection $AS_{x1}$ and $AS_{x2}$ to angles of reflection $AS'_{x1}$ and $AS'_{x2}$ after the Fourier lens arrangement 16. The angles of incidence $ER_{x1}$ and $ER_{x2}$ of the two illumination light part bundles $15_1$, $15_2$ on the entry face 33 of the same raster element 30 of the second raster arrangement 21 are also shown. In the view according to FIG. 17, this is the third raster element 30 from the top. FIG. 17 now shows the situation in which the same angles of incidence on the Fourier lens arrangement 16, in other words the angles $AS_{x1}$ and $AS_{x2}$ are transferred into different angles of reflection $AS'_{x1}$ and $AS'_{x2}$.

FIG. 17 in turn shows two alternatively possible effects of the second raster arrangement 21 and the raster element 30 acted upon by the two part bundles $15_1$, $15_2$. In a first bundle guidance shown by a continuous line in FIG. 17 the same emergent angle $AR_{x1}$, $AR_{x2}$ results for the two illumination light part bundles of $15_1$, $15_2$ leaving the raster element 30 of the second raster arrangement 21. As a main beam of the part bundles $15_1$, $15_2$ in this case runs along the z-axis, these emergent angles $AR_{x1}$ and $AR_{A2}$ are in each case zero. With an alternative optical effect of the second raster arrangement 21, shown by a dot-dash line in FIG. 17, an emergent angle $AR_{x1'}$ less than zero results for the illumination light part bundle $15_1$, in other words with a course component in the negative x-direction, and an emergent angle $AR_{x2'}$ greater than zero, in other words with a course component in the positive x-direction results for the part bundle $15_2$.

Figure 18:
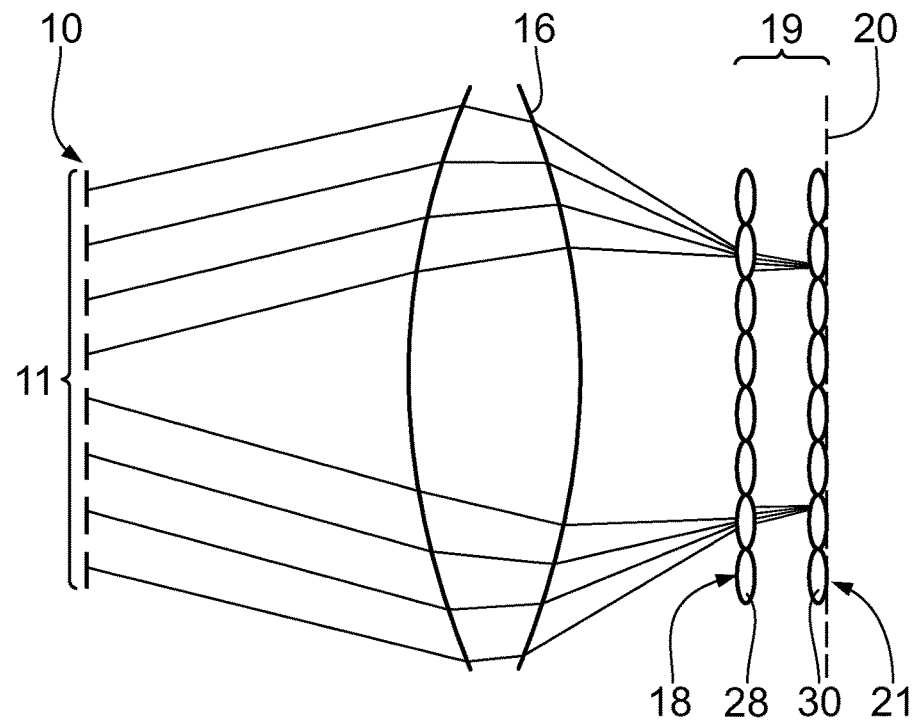
FIGS. 18 to 20 in views similar to FIGS. 3 and 4, show three variants of an illumination of the raster module with illumination light part bundles which are deflected by individual mirrors of the mirror array and in each case lead to the same illumination light intensity distribution in the illumination plane of the raster module, which may coincide with the pupil plane of the illumination optical system, a refractive effect of the Fourier lens arrangement in turn being shown.
Figure 19:
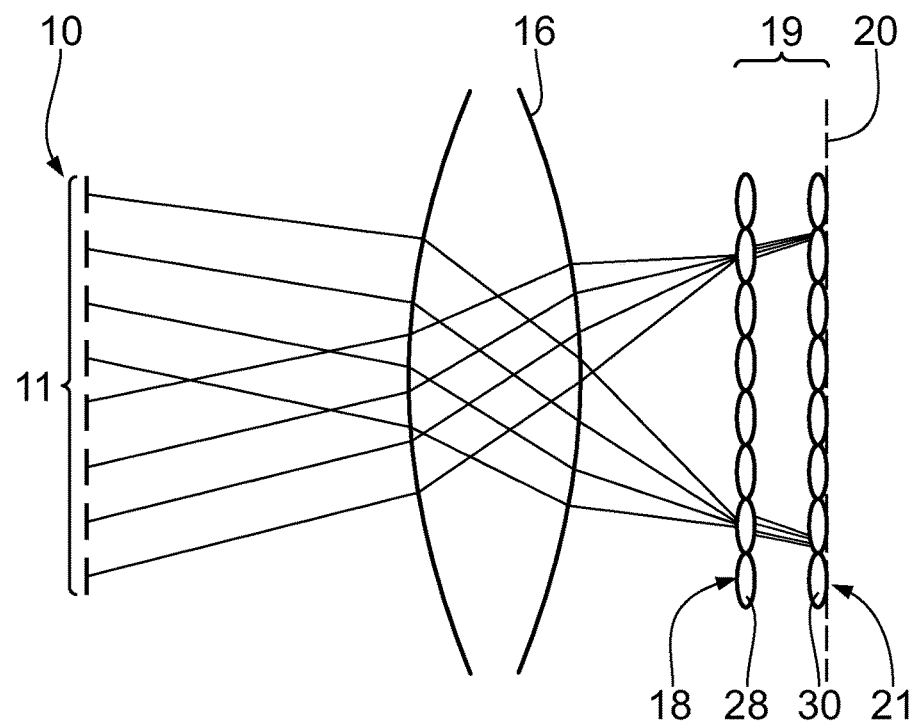
Figure 20:
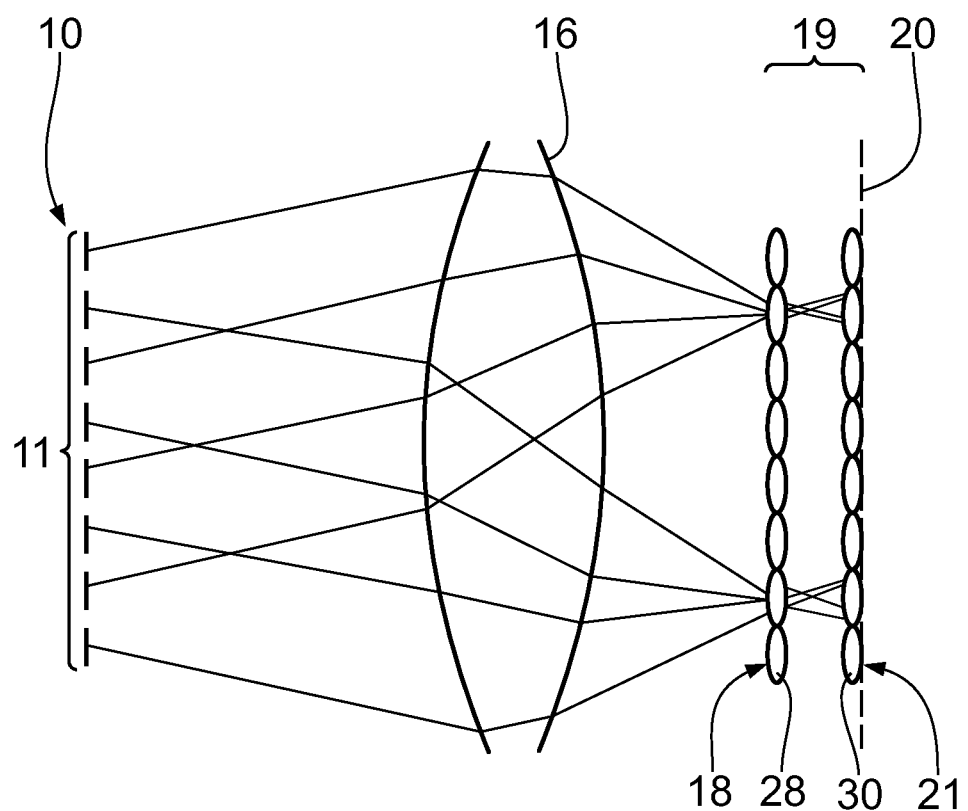

FIGS. 18 to 20 show alternative illuminations for the raster module 19, which, in the second illumination plane 20, in each case lead to the impingement of the same raster elements 30, but with different distributions of angles of incidence $ER_x$. The refractive effect of the Fourier lens arrangement is taken into account in FIGS. 18 to 20. Because of the different angles of incidence of the part bundles 15 on the raster elements 28 and 30 of the two raster arrangements 18 and 21, different field-dependent effects of the illumination of the object field 3 can be produced, as already described above.

A substrate or a wafer in the wafer plane 27 is firstly provided for the microlithographic production of microstructured or nanostructured components with the projection exposure system 1. At least one layer of a light-sensitive material is applied to the wafer. A reticle having structures to be imaged is furthermore provided in the reticle plane 4. The part of the reticle arranged in the object field 3 is then projected, using the projection exposure system 1, onto a region of the layer arranged in the image field.

From the foregoing, it is apparent that the two raster arrangements 18, 21, at least for specific emergent angles $AR_{xm}$ of the illumination light part bundle 15, are configured in such a way that small changes in the angle of incidence $ER_x$ of the illumination light part bundles 15 on the raster elements 30 of the second raster arrangement 21 lead to great changes in the emergent angle $AR_x$ of the illumination light part bundles 15 from the raster elements 30.

What is claimed is:

1. An optical system, comprising:
   a mirror array comprising a plurality of mirrors;
   a plurality of actuators, each mirror being independently tiltable via an associated actuator;
   a controller configured to activate the actuators; and
   a raster module configured to produce a spatially distributed arrangement of secondary light sources, the raster module being in a region of a plane of the optical system in which an emergent angle at which an illumination light part bundle leaves one of the raster elements is precisely allocated to a location region in an object field of the optical system on which the illumination light part bundle impinges,
   wherein the controller is configured so that specifying a tilting angle for each individual mirror allocates a predetermined field-dependent desired course of illumination angle intensity distributions by which object field points distributed over the object field are impinged upon, and
   wherein:
      the raster module comprises two raster arrangements arranged one behind another in a beam path of the illumination light;
      each of the two raster arrangements comprises a plurality of raster elements;
      the two raster arrangements are configured so that a diameter of the illumination light part bundle, as it impinges on an impingement face one of the raster elements of the second raster arrangement, is less than half of the impingement face of the raster element of the second raster arrangement;
      one of the following conditions holds:
         at least for certain emergent angles of the illumination light part bundles, the two raster arrangements are configured so that, depending on an impingement location on the raster elements of the second raster arrangement at least for angles of incidence which are in each case allocated to the respective impingement location of the illumination light part bundle on the raster elements of the second raster arrangement, the same emergent angle of the illumination light part bundles from the raster element results,
         at least for certain emergent angles of the illumination light part bundle, the two raster arrangements are configured so that small changes in an angle of incidence of the illumination light part bundles on the raster elements of the second raster arrangement lead to great changes in the emergent angle of the illumination light part bundles from the raster elements; and the optical system is a microlithography illumination optical system.

2. The optical system of claim 1, wherein the raster module is in the plane, and the plane is adjacent a pupil plane of the optical system.

3. The optical system of claim 1, wherein, at least for certain emergent angles of the illumination light part bundles, the two raster arrangements are configured so that depending on an impingement location on the raster elements of the second raster arrangement at least for angles of incidence which are in each case allocated to the respective impingement location of the illumination light part bundle on the raster elements of the second raster arrangement the same emergent angle of the illumination light part bundles from the raster element results.

4. The optical system of claim 3, wherein the same emergent angle which results depends on the impingement location.

5. The optical system of claim 1, wherein, at least for certain emergent angles of the illumination light part bundle, the two raster arrangements are configured so that small changes in an angle of incidence of the illumination light part bundles on the raster elements of the second raster arrangement lead to great changes in the emergent angle of the illumination light part bundles from the raster elements.

6. The optical system of claim 1, wherein the raster module and the controller are configured so that a predetermined distribution of actual tilting angles of the individual mirrors and a predetermined distribution of actual angles of incidence of the illumination light part bundles on the raster elements are allocated to a predetermined desired course of illumination light angle intensity distributions with which object field points distributed over the object field are impinged upon, and this allocation is present along two dimensions of the object field which are perpendicular to one another.

7. The optical system of claim 1, further comprising a Fourier lens arrangement between the mirror array and the raster module.

8. An apparatus comprising:
an illumination optical system which comprises:
a mirror array comprising a plurality of mirrors;
a plurality of actuators, each mirror being independently tiltable via an associated actuator;
a controller configured to activate the actuators; and
a raster module configured to produce a spatially distributed arrangement of secondary light sources, the raster module being in a region of a plane of the optical system in which an emergent angle at which an illumination light part bundle leaves one of the raster elements is precisely allocated to a location region in an object field of the optical system on which the illumination light part bundle impinges; and
a projection objective,
wherein:
the raster module comprises two raster arrangements arranged one behind another in a beam path of the illumination light;
each of the two raster arrangements comprises a plurality of raster elements;

the two raster arrangements are configured so that a diameter of the illumination light part bundle, as it impinges on an impingement face one of the raster elements of the second raster arrangement, is less than half of the impingement face of the raster element of the second raster arrangement;

one of the following conditions holds:
at least for certain emergent angles of the illumination light part bundles, the two raster arrangements are configured so that, depending on an impingement location on the raster elements of the second raster arrangement at least for angles of incidence which are in each case allocated to the respective impingement location of the illumination light part bundle on the raster elements of the second raster arrangement, the same emergent angle of the illumination light part bundles from the raster element results, at least for certain emergent angles of the illumination light part bundle, the two raster arrangements are configured so that small changes in an angle of incidence of the illumination light part bundles on the raster elements of the second raster arrangement lead to great changes in the emergent angle of the illumination light part bundles from the raster elements; and the apparatus is a microlithography projection exposure apparatus.

9. The apparatus of claim 8, wherein the raster module is in the plane, and the plane is adjacent a pupil plane of the optical system.

10. The apparatus of claim 8, wherein, at least for certain emergent angles of the illumination light part bundles, the two raster arrangements are configured so that depending on an impingement location on the raster elements of the second raster arrangement at least for angles of incidence which are in each case allocated to the respective impingement location of the illumination light part bundle on the raster elements of the second raster arrangement the same emergent angle of the illumination light part bundles from the raster element results.

11. The apparatus of claim 10, wherein the same emergent angle which results depends on the impingement location.

12. The apparatus of claim 8 wherein, at least for certain emergent angles of the illumination light part bundle, the two raster arrangements are configured so that small changes in an angle of incidence of the illumination light part bundles on the raster elements of the second raster arrangement lead to great changes in the emergent angle of the illumination light part bundles from the raster elements.

13. The apparatus of claim 8, wherein the raster module and the controller are configured so that a predetermined distribution of actual tilting angles of the individual mirrors and a predetermined distribution of actual angles of incidence of the illumination light part bundles on the raster elements are allocated to a predetermined desired course of illumination light angle intensity distributions with which object field points distributed over the object field are impinged upon, and this allocation is present along two dimensions of the object field which are perpendicular to one another.

14. The apparatus of claim 8, further comprising a primary light source.

15. The apparatus of claim 8, wherein the raster module is in the plane, and the plane is conjugated to and is spaced apart a pupil plane of the projection objective.

16. The apparatus of claim 8, further comprising further comprising a Fourier lens arrangement between the mirror array and the raster module.

17. A method of using a microlithography projection exposure apparatus comprising an illumination optical system and a projection objective, the method comprising:
- using the optical system to illuminate a reticle having structures; and
- using the projection objective to project at least a part of the reticle onto a light-sensitive material, wherein:
- the illumination optical system, comprises:
  - a mirror array comprising a plurality of mirrors;
  - a plurality of actuators, each mirror being independently tiltable via an associated actuator;
  - a controller configured to activate the actuators; and
  - a raster module configured to produce a spatially distributed arrangement of secondary light sources, the raster module being in a region of a plane of the optical system in which an emergent angle at which an illumination light part bundle leaves one of the raster elements is precisely allocated to a location region in an object field of the optical system on which the illumination light part bundle impinges;
- the controller is configured so that specifying a tilting angle for each individual mirror allocates a predetermined field-dependent desired course of illumination angle intensity distributions by which object field points distributed over the object field are impinged upon;
- the raster module comprises two raster arrangements arranged one behind another in a beam path of the illumination light;
- each of the two raster arrangements comprises a plurality of raster elements;
- the two raster arrangements are configured so that a diameter of the illumination light part bundle, as it impinges on an impingement face one of the raster elements of the second raster arrangement, is less than half of the impingement face of the raster element of the second raster arrangement; and
- one of the following holds:
  - at least for certain emergent angles of the illumination light part bundles, the two raster arrangements are configured so that, depending on an impingement location on the raster elements of the second raster arrangement at least for angles of incidence which are in each case allocated to the respective impingement location of the illumination light part bundle on the raster elements of the second raster arrangement, the same emergent angle of the illumination light part bundles from the raster element results,
  - at least for certain emergent angles of the illumination light part bundle, the two raster arrangements are configured so that small changes in an angle of incidence of the illumination light part bundles on the raster elements of the second raster arrangement lead to great changes in the emergent angle of the illumination light part bundles from the raster elements.

18. The method of claim 17, wherein the raster module is in the plane, and the plane is conjugated to and is spaced apart from a pupil plane of the projection objective.

19. The method of claim 17, further comprising a Fourier lens arrangement between the mirror array and the raster module.

* * * * *

UNITED STATES PATENT AND TRADEMARK OFFICE
CERTIFICATE OF CORRECTION

PATENT NO. : 9,933,704 B2
APPLICATION NO. : 13/681938
DATED : April 3, 2018
INVENTOR(S) : Michael Patra, Markus Deguenther and Michael Layh Page 1 of 1

It is certified that error appears in the above-identified patent and that said Letters Patent is hereby corrected as shown below:

Column 13, Line 8: Delete "$AR_{xr2}$ for," and insert -- $AR_{xr2}$, --, therefor.

Column 15, Line 44: Delete "$AS'_{x2}$" and insert -- $AS'_{x2}$. --, therefor.

Column 15, Line 53: Delete "$AR_{A2}$" and insert -- $AR_{x2}$ --, therefor.

Column 19, Lines 1-2 (Claim 16): Delete "further comprising further comprising" and insert -- further comprising --, therefor.

Signed and Sealed this
Nineteenth Day of June, 2018

Andrei Iancu
*Director of the United States Patent and Trademark Office*